VARIABLE-GAIN TRANSISTOR CIRCUIT

Filed Feb. 9, 1959

INVENTOR
IRVING HOROWITZ

BY *Rines and Rines*

ATTORNEYS

United States Patent Office 3,023,369

Patented Feb. 27, 1962

3,023,369

VARIABLE-GAIN TRANSISTOR CIRCUIT

Irving Horowitz, Eatontown, N.J., assignor to Blonder-Tongue Electronics, Newark, N.J., a corporation of New Jersey Filed Feb. 9, 1959, Ser. No. 792,023
6 Claims. (Cl. 330—24)

The present invention relates to transistor amplifier circuits, and, more particularly, to such circuits in which the gain is to be varied over a relatively wide range of signal-amplitude levels.

It is known that the base-to-emitter resistance and capacitance of a transistor amplifier stage, operating, for example, as a grounded-emitter amplifier, vary both as a function of the frequency of the input signal and the current transmitted through the transistor. Several deleterious effects are thus produced as the gain of such amplifier stages is changed. The ratio of the low-to-high-frequency gain of such a stage, for example, will change with variation in the gain of the stage. If a signal-boosting peaking circuit were to be employed preceding the stage, variation in the gain of the stage would upset the peaking characteristics. With the transistor operated at low gain, moreover, the non-linear part of its characteristic near cut-off introduces distortion in the amplified signal, reducing the output capability of the stage.

An object of the present invention, accordingly, is to provide a new and improved transistor amplifier circuit, the gain of which may be varied either manually, or, preferably, automatically under the control of an appropriate voltage or current, and that shall not be subject to any of the above-described deleterious effects.

A further object is to provide a new and improved transistor amplifier stage.

Other and further objects will be explained hereinafter, and will be more particularly pointed out in the appended claims.

Figure 1:
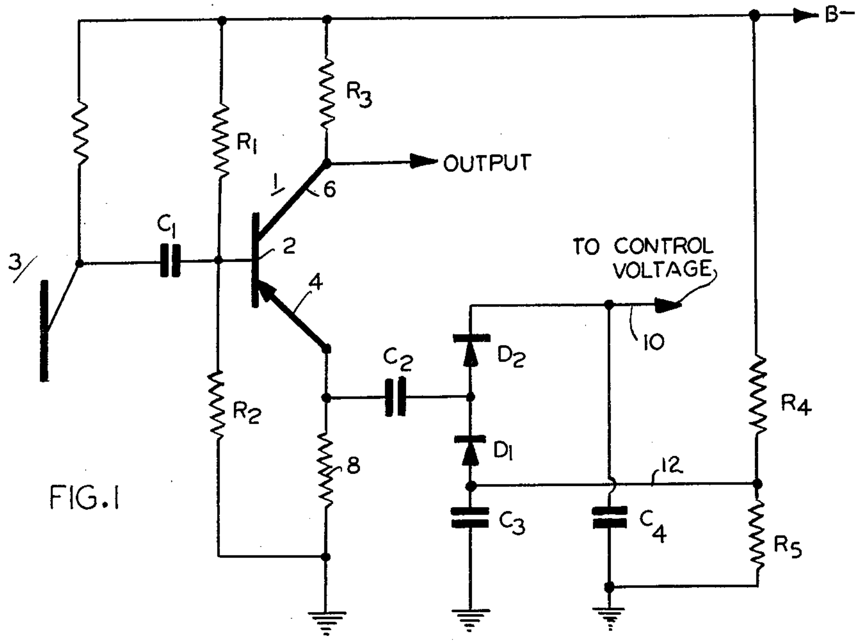
Figure 2:
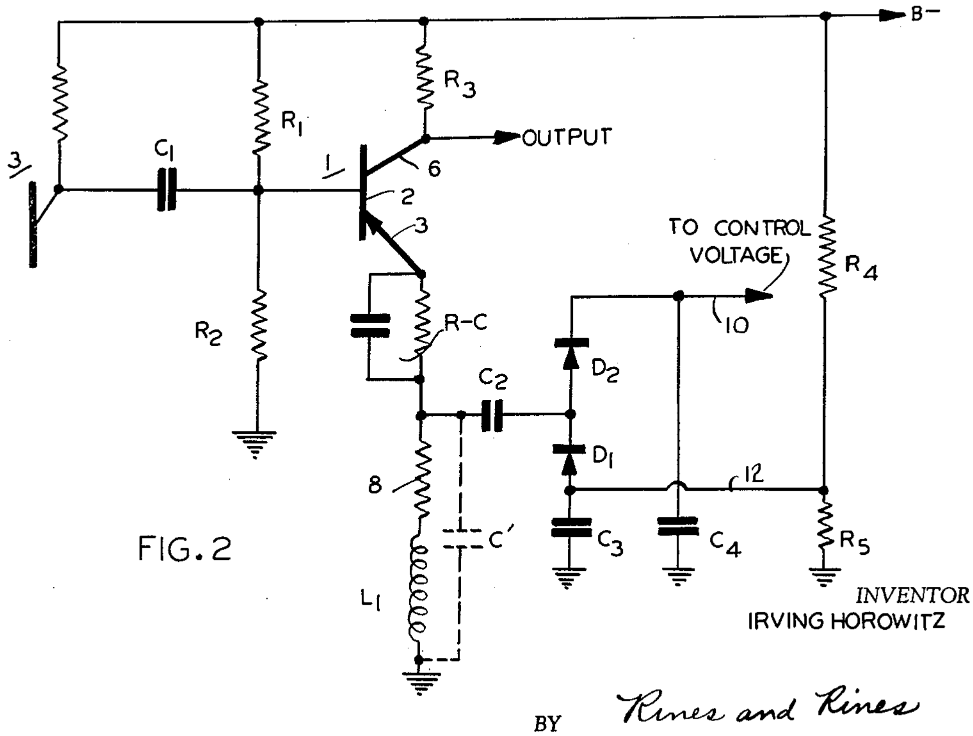

The invention will now be described in connection with the accompanying drawing, FIG. 1 of which is a schematic circuit diagram illustrating the invention in preferred form; and FIG. 2 is a similar view of a modification.

Referring to FIG. 1, a transistor amplifier stage of the grounded-emitter type is shown comprising a base 2, an emitter 4 and a collector 6. The stage 1 receives input signals, such as alternating-current video signals and the like, through an input-circuit coupling capacitor $C_1$ from a preceding stage 3. Bias current for the base 2 may be provided by the network $R_1$, $R_2$ connected between the negative terminal B— of the current supply and ground. The term "ground," moreover, as herein employed, is intended to connote not only actual earthing, but connection to chassis or other reference potential. The collector 6 is biased through a resistor $R_3$. Connected between the emitter 4 and ground is an emitter load 8, shown as a resistance. The load 8 is thus disposed in the output circuit of the stage, between the collector 6 and the emitter 4.

In accordance with the present invention, the effective emitter load impedance or resistance is varied in order to control the gain of the stage 1. Such variation does not, however, reduce the output capability of the stage 1, since one does not thereby vary the current through the transistor amplifier, but only the amount of degeneration in the emitter circuit. The signal or other alternating-current voltage developed across the emitter load 8 is coupled by a path including capacitor $C_2$, large enough to transfer all the desired signal frequencies, to develop the same across a first variable-impedance element, shown as a diode $D_1$, the signal or alternating-current impedance or resistance of which varies as a function of control voltage or current applied to the diode $D_1$. Other types of similar variable-impedance elements may also be employed but the diode is preferred; being, for example, of the solid-state type or a vacuum diode. The signal impedance of the diode or other variable-impedance element $D_1$, if bias is applied in a back direction, increases with increase in bias; or, if the bias is applied in the forward direction, the impedance decreases with increase in bias. The variable-impedance element $D_1$ thus changes the effective signal of alternating-current load impedance in the emitter circuit, varying the gain of the emitter stage 1. The gain of the transistor 1 is thus rendered variable without varying the current through the transistor and without varying the output capability of the stage.

In actual practice, however, the diode $D_1$ itself produces distortion, as result of its non-linear characteristics. This is obviated, in accordance with the present invention, by adding a further diode $D_2$ connected with opposite poling to that of the diode $D_1$, and in series circuit therewith, from the direct-current point of view. By-pass capacitors $C_3$ and $C_4$ are provided, the signals occurring in the emitter load 8 developing across both the diodes $D_1$ and $D_2$. By the above-mentioned connections, as the signals are applied to both diodes $D_1$, $D_2$, one diode will have its current increased while the other diode has its current correspondingly decreased. The signal or alternating-current impedance of the diodes will therefore vary in opposite directions, so that the net signal or alternating-current impedance of the pair of variable-impedance elements $D_1$, $D_2$ will not vary. Since, however, the diodes $D_1$ and $D_2$ are in series circuit, from the direct-current point of view, the effective emitter-circuit load impedance will vary with a control voltage or current applied to the diodes $D_2$ and $D_1$ by conductor 10. The variation in gain of the transistor stage 1 thus takes place without any distortion effects that would otherwise be inherent in the use of individual diodes $D_1$, $D_2$ or other similar non-linear variable impedance devices.

While it is most advantageous for many applications to apply a control voltage or current along conductor 10, thus to vary the effective shunt resistance in the emitter circuit through variation in the direct-current impedance of the diodes $D_1$ and $D_2$, it is, of course, to be understood that the invention may also be used with manual control, whereby a voltage is manually set at the conductor 10. While the diode $D_1$ is shown connected by conductor 12 to an intermediate point of the voltage dividers $R_4$, $R_5$, to receive back bias, if the source of the control voltage were adapted for both positive and negative voltage variations, such back-biasing might not be necessary.

There are, however, still further factors at play in connection with the amplifier stage 1 that cause variations in the circuit as the gain is changed, and these may also be compensated for in accordance with the present invention. In the first place, the emitter load resistor 8, together with the effective emitter-to-ground distributed capacitance of the circuit C′, FIG. 2, acts as a peaking circuit for particular frequencies. By inserting an appropriate inductance $L_1$ in the emitter circuit to ground, as illustrated in FIG. 2, one can avoid emitter-circuit peaking at such frequencies through tuning out the effective distributed capacitance C′. As before stated, furthermore, the emitter-to-base resistance and capacitance change as the gain of the amplifier 1 varies. As the emitter-to-base resistance increases, however, the low-frequency gain of the amplifier stage increases at a faster rate than the high-frequency gain. To compensate for this effect, an appropriate RC or other peaking network may be inserted in the emitter circuit, FIG. 2, adjusted effectively to peak the high frequencies and thus to compensate for this discriminatory gain feature at the low frequencies.

With a 2N384-type transistor 1, for example, the following circuit values have been found to produce operation with the above-described advantageous results:

$R_1$=47K ohms; $R_2$=15K ohms; $R_3$=1000 ohms; resistance 8=4.7K ohms; $R_4$=22K ohms; $R_5$=1000 ohms; $C_2$=5 microfarads; $C_3$=$C_4$=10 microfarads; and $C_1$=0.1 microfarad. The diodes $D_1$ and $D_2$ may be 1N295 germanium diodes.

Further modifications will occur to those skilled in the art and all such are considered to fall within the spirit and scope of the invention, as defined in the appended claims.

What is claimed is:

1. A variable gain transistor amplifier having, in combination, a transistor provided with at least a base, an emitter, and a collector, a signal-input circuit connected to the base, an output circuit connected between the emitter and the collector, a direct current load connected in the output circuit to the emitter, a signal coupling path connected to said load, a pair of variable impedance elements the impedance of which varies in a predetermined direction as a function of applied electric energy, means connecting said elements to said signal coupling path in parallel with each other and with opposite polarity for signal electric energy such that the impedance of said elements varies in opposite directions with variation of signal energy, and means connecting said elements to a source of control electric energy in series with each other and with the same polarity for control electric energy such that the impedance of said elements varies in the same direction with variation of control electric energy, whereby the gain of the amplifier may be varied by varying said control electric energy.

2. A variable gain transistor amplifier as claimed in claim 1 and in which said variable impedance elements are diodes.

3. A variable gain transistor amplifier as claimed in claim 2 and in which at least one of the diode elements is back-biased.

4. A variable gain transistor amplifier as claimed in claim 1 and in which said signal coupling path comprises a coupling capacitor.

5. A variable gain transistor amplifier as claimed in claim 1 and in which the emitter load circuit includes a peaking network for peaking the signals of higher frequency in order to compensate for the more rapid lower-frequency change in base-to-emitter impedance as the gain of the amplifier is varied.

6. A variable gain transistor amplifier as claimed in claim 1 and in which the emitter-load circuit includes inductance for tuning out effective distributed capacitance from the emitter to ground at predetermined signal frequencies.

References Cited in the file of this patent

UNITED STATES PATENTS

| | | |
|---|---|---|
| 2,182,329 | Wheeler | Dec. 5, 1939 |
| 2,691,074 | Eberhard | Oct. 5, 1954 |
| 2,786,964 | De Witt | Mar. 26, 1957 |
| 2,808,474 | Maynard | Oct. 1, 1957 |
| 2,833,870 | Wilhelmsen | May 6, 1958 |
| 2,870,271 | Cronburg | Jan. 20, 1959 |
| 2,871,305 | Hurtig | Jan. 27, 1959 |

FOREIGN PATENTS

| | | |
|---|---|---|
| 216,799 | Australia | Aug. 20, 1958 |

OTHER REFERENCES

Shea: "Principles of Transistor Circuits," September 1953, p. 350.